(12) United States Patent
Chow et al.

(10) Patent No.: US 7,863,109 B2
(45) Date of Patent: Jan. 4, 2011

(54) INTEGRATED CIRCUIT PACKAGING SYSTEM WITH A PROTRUSION ON AN INNER STACKING MODULE AND METHOD OF MANUFACTURE THEREOF

(75) Inventors: Seng Guan Chow, Singapore (SG); Rui Huang, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/329,482

(22) Filed: Dec. 5, 2008

(65) Prior Publication Data
US 2010/0140809 A1 Jun. 10, 2010

(51) Int. Cl.
*H01L 21/00* (2006.01)
*H01L 23/04* (2006.01)

(52) U.S. Cl. .................. 438/126; 438/127; 257/730; 257/786; 257/790; 257/E23.126; 257/E23.128; 257/E21.503

(58) Field of Classification Search .................. None
See application file for complete search history.

(56) References Cited

U.S. PATENT DOCUMENTS

| | | | |
|---|---|---|---|
| 5,698,899 A * | 12/1997 | Hirakawa et al. | 257/712 |
| 7,306,974 B2 * | 12/2007 | Brand | 438/112 |
| 2007/0059865 A1 | 3/2007 | Huang et al. | |
| 2007/0284139 A1 * | 12/2007 | Chin et al. | 174/260 |
| 2008/0006925 A1 | 1/2008 | Yim et al. | |
| 2008/0099890 A1 | 5/2008 | Chen et al. | |
| 2008/0145589 A1 | 6/2008 | Hung et al. | |
| 2009/0152740 A1 | 6/2009 | Park et al. | |
| 2009/0243064 A1 * | 10/2009 | Camacho et al. | 257/680 |

* cited by examiner

*Primary Examiner*—Alonzo Chambliss
(74) *Attorney, Agent, or Firm*—Mikio Ishimaru (57) ABSTRACT

A method of manufacture of an integrated circuit packaging system includes: providing an inner stacking module die; encapsulating the inner stacking module die with an inner stacking module encapsulation to form an inner stacking module, the inner stacking module encapsulation having an inner stacking module protrusion having a planar protrusion surface; and encapsulating at least part of the inner stacking module encapsulation with an encapsulation having a flat top coplanar with the planar protrusion surface or fully encapsulating the inner stacking module encapsulation.

20 Claims, 8 Drawing Sheets

INTEGRATED CIRCUIT PACKAGING SYSTEM WITH A PROTRUSION ON AN INNER STACKING MODULE AND METHOD OF MANUFACTURE THEREOF

TECHNICAL FIELD

The present invention relates generally to an integrated circuit packaging system and more particularly to a system for utilizing a protrusion on an inner stacking module in an integrated circuit packaging system.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these packaging systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an inner stacking module die; encapsulating the inner stacking module die with an inner stacking module encapsulation to form an inner stacking module, the inner stacking module encapsulation having an inner stacking module protrusion having a planar protrusion surface; and encapsulating at least part of the inner stacking module encapsulation with an encapsulation having a flat top coplanar with the planar protrusion surface or fully encapsulating the inner stacking module encapsulation.

The present invention provides an integrated circuit packaging system including: an inner stacking module die; an inner stacking module encapsulation encapsulating the inner stacking module die to form an inner stacking module, the inner stacking module encapsulation having an inner stacking module protrusion having a planar protrusion surface; and an encapsulation encapsulating at least part of the inner stacking module encapsulation having a flat top coplanar with the planar protrusion surface or fully encapsulating the inner stacking module encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the inner stacking module die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 1:
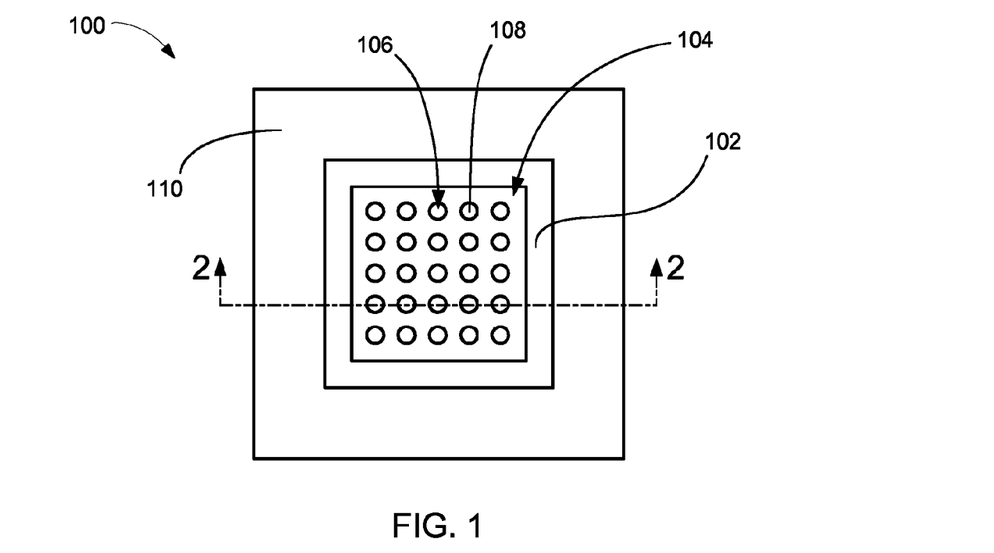
FIG. 1 is a top view of an integrated circuit packaging system in a first embodiment of the present invention.

Referring now to FIG. 1, therein is shown a top view of an integrated circuit packaging system 100 in a first embodiment of the present invention. The integrated circuit packaging system 100 is shown having an inner stacking module protrusion 102 surrounding an inner stacking module cavity 104.

The inner stacking module cavity 104 has inner contact pads 106 having an exposed surface 108 inside the inner stacking module protrusion 102. Partially encapsulating the inner stacking module protrusion 102 is an encapsulation 110.

Figure 2:
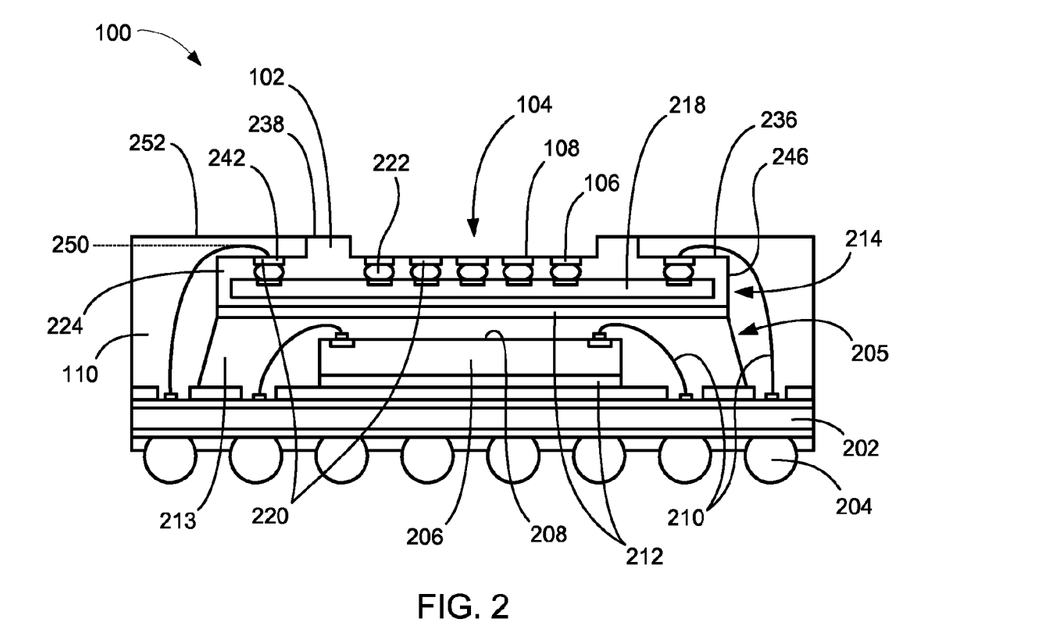
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having a substrate 202 such as a laminated plastic or ceramic substrate.

Below the substrate 202, external interconnects 204 such as solder bumps are mounted. Mounted above the substrate 202 is an inner package 205 having an integrated circuit die 206 such as a wire-bonded die, with an active side 208. The active side 208 of the integrated circuit die 206 is connected to the substrate 202 with internal interconnects such as bond wires 210.

The integrated circuit die 206 is attached to the substrate 202 with a die attach adhesive 212. The inner package 205 has an inner encapsulation 213 encapsulating the integrated circuit die 206. Mounted above the inner package 205 is an inner stacking module 214. The inner stacking module 214 is attached to the inner package 205 with the die attach adhesive 212.

The inner stacking module 214 has an inner stacking module die 218 such as a flip chip. Contact pads 220 are mounted above the inner stacking module die 218. The inner stacking module die 218 is connected to the contact pads 220 with internal interconnects such as solder balls 222.

The inner stacking module die 218 and the solder balls 222 are encapsulated by an inner stacking module encapsulation 224. The contact pads 220 are partially encapsulated by the inner stacking module encapsulation 224 but have the exposed surface 108 exposed from the inner stacking module encapsulation 224.

The inner stacking module encapsulation 224 is formed into the inner stacking module protrusions 102. It has been discovered that the inner stacking module protrusions 102 may be used as a stiffener or a reinforcement to prevent warpage of the inner stacking module 214 and the integrated circuit packaging system 100.

In greater detail, the inner stacking module protrusions 102 extends vertically from a top surface 236 of the inner stacking module 214 and ends creating a planar protrusion surface 238. It has been discovered that the planar protrusion surface 238 reduces production cost by allowing the use of conventional molding chases during encapsulation phases of manufacture. This reduces design time.

The contact pads 220 of the inner stacking module 214 may be distinguished into outer contact pads 242 and the inner contact pads 106 pad are separated by the inner stacking module protrusions 102. The outer contact pads 242 are exposed from the top surface 236 of the inner stacking module 214, and along a perimeter 246.

The inner contact pads 106 are interior to the inner stacking module protrusions 102 and inside the inner stacking module cavity 104. The inner stacking module cavity 104 is formed between the inner stacking module protrusions 102. The inner stacking module cavity 104 contains the exposed surface 108 of the inner contact pads 106 exposed on the top surface 236 of the inner stacking module 214.

The outer contact pads 242 of the inner stacking module 214 are connected to the substrate 202 with the bond wires 210. It has been discovered that the planar protrusion surface 238 of the inner stacking module protrusions 102 should be above a height 250 of the bond wires 210 thus allowing a conventional flat mold chase to be used when encapsulating the integrated circuit packaging system 100.

The encapsulation 110 has a flat top 252, which is coplanar with the planar protrusion surface 238 of the inner stacking module protrusion 102. It has been discovered that the flat top 252 of the encapsulation 110 in combination with the planar protrusion surface 102 allows the inner stacking module 214 to be encapsulated by the encapsulation 110 by using a conventional flat mold chase while creating the inner stacking module cavity 104. This decreases design time and production equipment investment while adding greater functionality and performance to package-in-package integrated circuit packaging systems.

The encapsulation 110 encapsulates the inner stacking module 214, the inner package 205, and the bond wires 210. The encapsulation 110 protects sensitive components from moisture, dust and other contamination.

Figure 3:
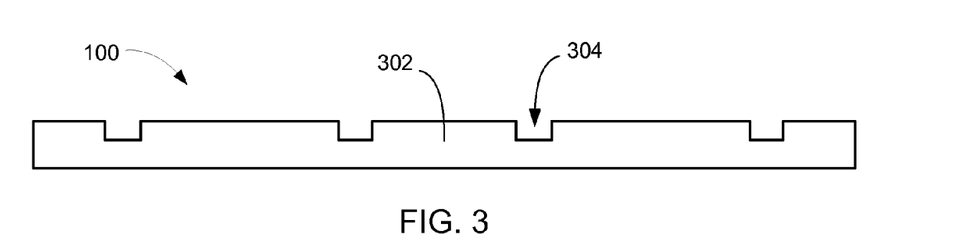
FIG. 3 is the integrated circuit packaging system of FIG. 2 in a carrier phase of manufacture.

Referring now to FIG. 3, therein is shown the integrated circuit packaging system 100 of FIG. 2 in a carrier phase of manufacture. The integrated circuit packaging system 100 is shown having a carrier 302.

The carrier 302 has carrier cavities 304, which can be formed by photo patterning and etching. The carrier 302 may be copper, aluminum, or dummy silicon.

Figure 4:
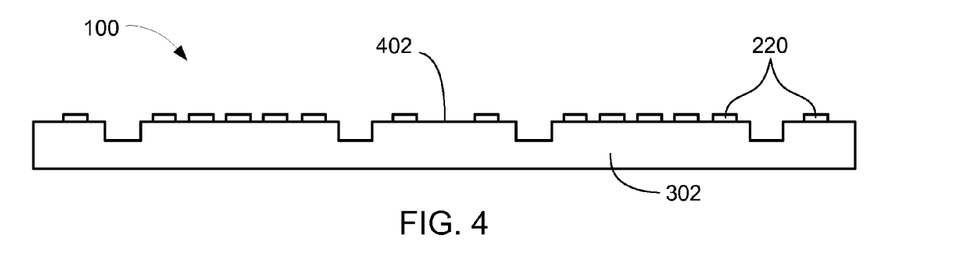
FIG. 4 is the integrated circuit packaging system of FIG. 2 after a contact pad phase of manufacture.

Referring now to FIG. 4, therein is shown the integrated circuit packaging system 100 of FIG. 2 after a contact pad phase of manufacture. The integrated circuit packaging system 100 is shown having the contact pads 220 plated on a top surface 402 of the carrier 302. The contact pads 220 may be deposited by electro plating or thin film deposition.

Figure 5:
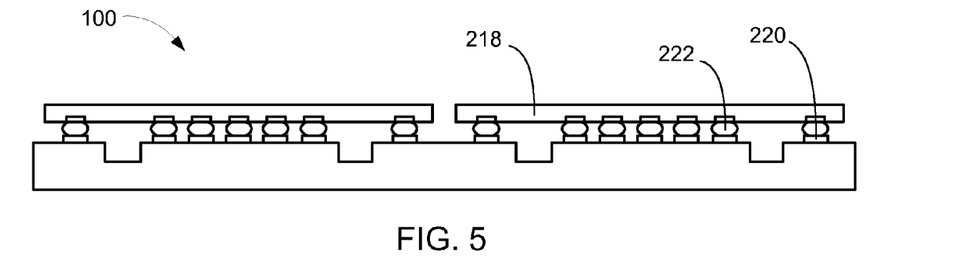
FIG. 5 is the integrated circuit packaging system of FIG. 2 after a mounting phase of manufacture.

Referring now to FIG. 5, therein is shown the integrated circuit packaging system 100 of FIG. 2 after a mounting phase of manufacture. The integrated circuit packaging system 100 is shown having the inner stacking module die 218 connected to the contact pads 220 with the solder balls 222.

Figure 6:
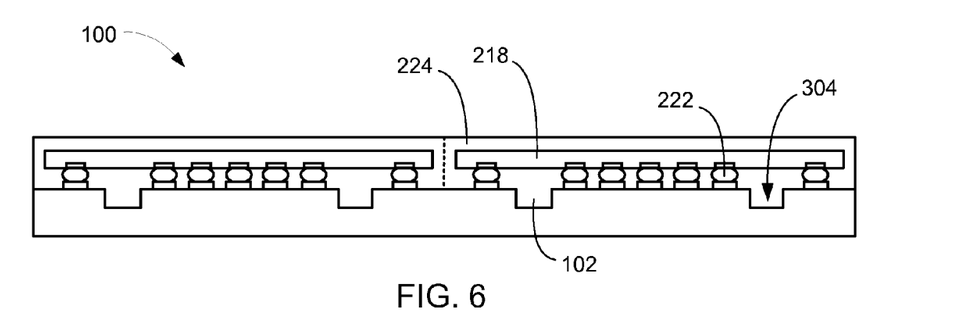
FIG. 6 is the integrated circuit packaging system of FIG. 2 after an encapsulating phase of manufacture.

Referring now to FIG. 6, therein is shown the integrated circuit packaging system 100 of FIG. 2 after an encapsulating phase of manufacture. The integrated circuit packaging system 100 is shown having the inner stacking module encapsulation 224 encapsulating the inner stacking module die 218 and the solder balls 222. Optionally an underfill may be used to provide additional structural rigidity between the solder balls 222.

The inner stacking module protrusions 102 are shown formed in the inner stacking module encapsulation 224 by the carrier cavities 304.

Figure 7:
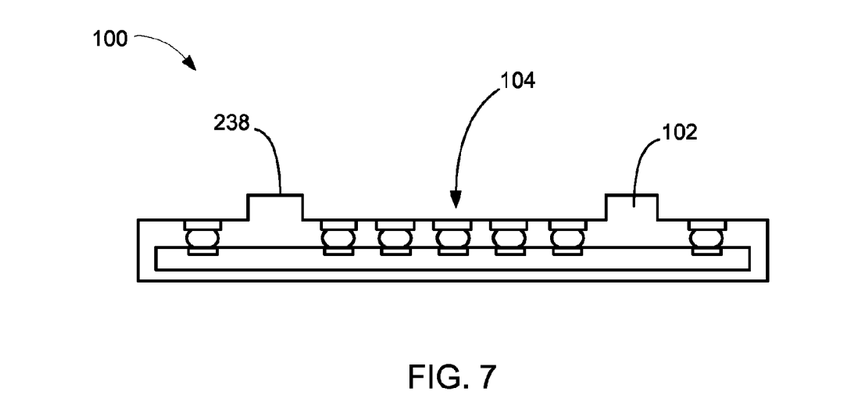
FIG. 7 is the integrated circuit packaging system of FIG. 2 after a carrier removal phase of manufacture.

Referring now to FIG. 7, therein is shown the integrated circuit packaging system 100 of FIG. 2 after a carrier removal phase of manufacture. The integrated circuit packaging system 100 is shown having the inner stacking module protrusions 102 formed with the planar protrusion surface 238.

Figure 8:
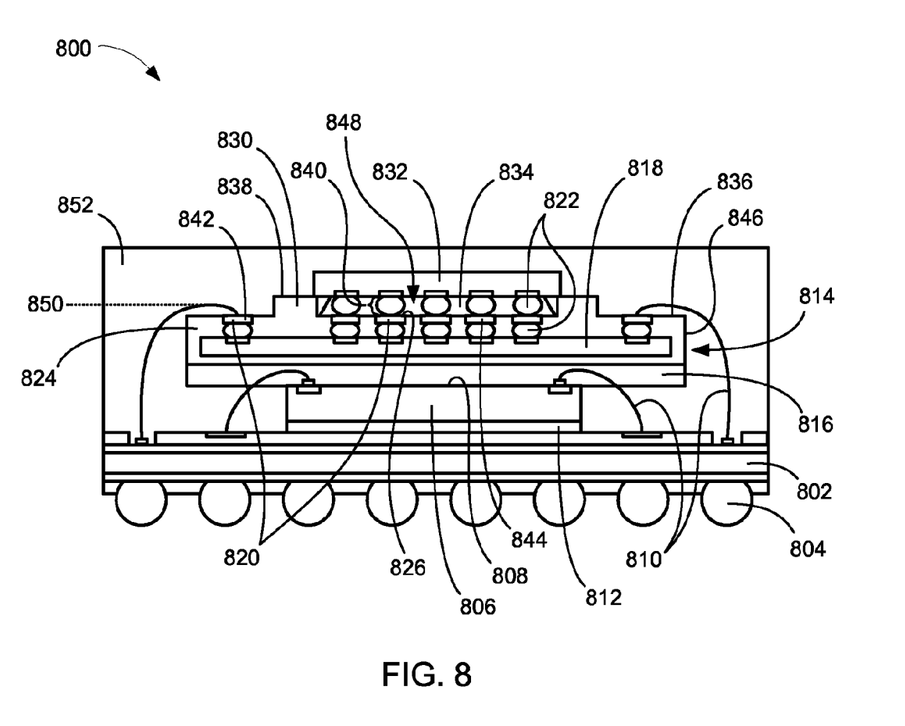
FIG. 8 is a cross-sectional view of an integrated circuit packaging system in a second embodiment of the present invention.

Referring now to FIG. 8, therein is shown a cross-sectional view of an integrated circuit packaging system 800 in a second embodiment of the present invention. The integrated circuit packaging system 800 is shown having a substrate 802 such as a laminated plastic or ceramic substrate.

Below the substrate 802, external interconnects 804 such as solder bumps are mounted. Mounted above the substrate 802 is a first integrated circuit die 806 such as a wire-bonded die, with an active side 808. The active side 808 of the first integrated circuit die 806 is connected to the substrate 802 with internal interconnects such as bond wires 810.

The first integrated circuit die 806 is attached to the substrate 802 with a die attach adhesive 812. Mounted above the first integrated circuit die 806 is an inner stacking module 814. The inner stacking module 814 is attached to the first integrated circuit die 806 with a wire-in-film adhesive 816.

The wire-in-film adhesive 816 has a low viscosity and, as temperature increases, the viscosity gets lower. Therefore, the wire-in-film adhesive 816 can be easily pressed over the bond wires 810, above, and around the first integrated circuit die 806 and then cured to harden the wire-in-film adhesive 816.

It has been discovered that the wire-in-film adhesive 816 should be a thermally conductive dielectric material. The wire-in-film adhesive 816 can be made of a B-stage material that can be hardened after curing and can maintain a predetermined thickness.

The inner stacking module 814 has an inner stacking module die 818 such as a flip chip. Contact pads 820 are mounted above the inner stacking module die 818. The inner stacking module die 818 is connected to the contact pads 820 with internal interconnects such as solder balls 822.

The inner stacking module die 818 and the solder balls 822 are encapsulated by an inner stacking module encapsulation 824. The contact pads 820 are partially encapsulated by the inner stacking module encapsulation 824 but have an exposed surface 826 exposed from the inner stacking module encapsulation 824.

The inner stacking module encapsulation 824 is formed into inner stacking module protrusions 830. It has been discovered that the inner stacking module protrusions 830 may be used as a stiffener or a reinforcement to prevent warpage of the inner stacking module 814 and the integrated circuit packaging system 800.

Mounted above the inner stacking module 814 is a second integrated circuit die 832 such as a flip chip. The second integrated circuit die 832 is connected to the contact pads 820 with the solder balls 822. The inner stacking module protrusions 830 contacts the second integrated circuit die 832 and helps support the integrated circuit die.

It has been discovered that the inner stacking module protrusions 830 may act as a solder ball standoff height structure helping to prevent excess stress on the solder balls 822 connecting the second integrated circuit die 832 to the contact pads 820 resulting in more reliable contacts with an increased life span. It has been further discovered that the inner stacking module protrusions 830 help to support additional integrated circuit packages above the inner stacking module 814.

Between the second integrated circuit die 832 and the inner stacking module 814 is an underfill 834. The underfill 834 further strengthens and secures the solder balls 822. It has been discovered that the inner stacking module protrusions 830 act as a barrier to contain the underfill 834 and prevent overspreading, which may result in contamination of the contact pads 820.

In greater detail, the inner stacking module protrusions 830 extends vertically from a top surface 836 of the inner stacking module 814 and ends creating a planar protrusion surface 838. The planar protrusion surface 838 may contact the second integrated circuit die 832 to act as a structural support both to support the mass of the second integrated circuit die 832 and to produce a standoff height 840 for the solder balls 822. The planar protrusion surface 838 should be above a height 850 of the bond wires 810.

The contact pads 820 of the inner stacking module 814 may be distinguished into outer contact pads 842 and inner contact pads 844. The outer contact pads 842 are exposed from the top surface 836 of the inner stacking module 814, and along a perimeter 846.

The inner contact pads 844 are interior to the inner stacking module protrusions 830 and inside an inner stacking module cavity 848. The inner stacking module cavity 848 is formed between the inner stacking module protrusions 830. The inner stacking module cavity 848 contains the exposed surface 826 of the inner contact pads 844 exposed on the top surface 836 of the inner stacking module 814.

The outer contact pads 842 of the inner stacking module 814 are connected to the substrate 802 with the bond wires 810. An encapsulation 852 encapsulates the inner stacking module 814, the first integrated circuit die 806, the second integrated circuit die 832, and the bond wires 810. The encapsulation 852 protects sensitive components from moisture, dust and other contamination.

Figure 9:
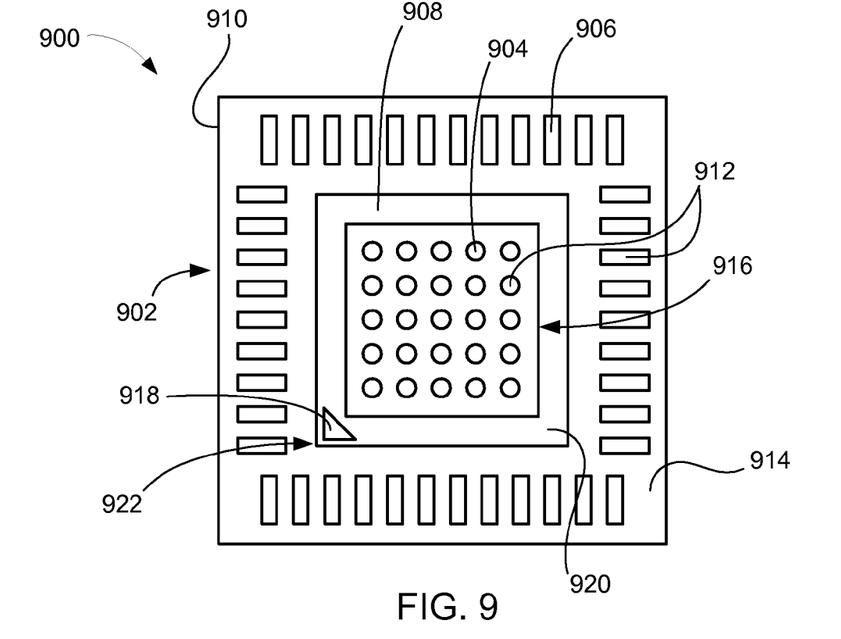
FIG. 9 is a top view of an integrated circuit packaging system in a third embodiment of the present invention and after an inner stacking module forming phase of manufacture.

Referring now to FIG. 9, therein is shown a top view of an integrated circuit packaging system 900 in a third embodiment of the present invention and after an inner stacking module forming phase of manufacture. The integrated circuit packaging system 900 is shown having an inner stacking module 902.

The inner stacking module 902 is shown having inner contact pads 904 and outer contact pads 906. The outer contact pads 906 are external to inner stacking module protrusions 908 and are formed along a perimeter 910 of the inner stacking module 902. The inner contact pads 904 and the outer contact pads 906 have an exposed surface 912 exposed from a top surface 914 of the inner stacking module 902.

The inner contact pads 904 are interior to the inner stacking module protrusions 908, and inside an inner stacking module cavity 916. The inner stacking module cavity 916 is created when the top surface 914 of the inner stacking module 902 is surrounded by the inner stacking module protrusions 908.

An alignment indicia 918 may be formed on a planar protrusion surface 920 of the inner stacking module protrusions 908. The alignment indicia 918 may be formed on a corner 922 of the inner stacking module protrusions 908 and may be formed by metal deposition or plating. The alignment indicia on the corner 922 of the inner stacking module protrusions 908 is applicable for high I/O devices where transmission real estate is critical.

Figure 10:
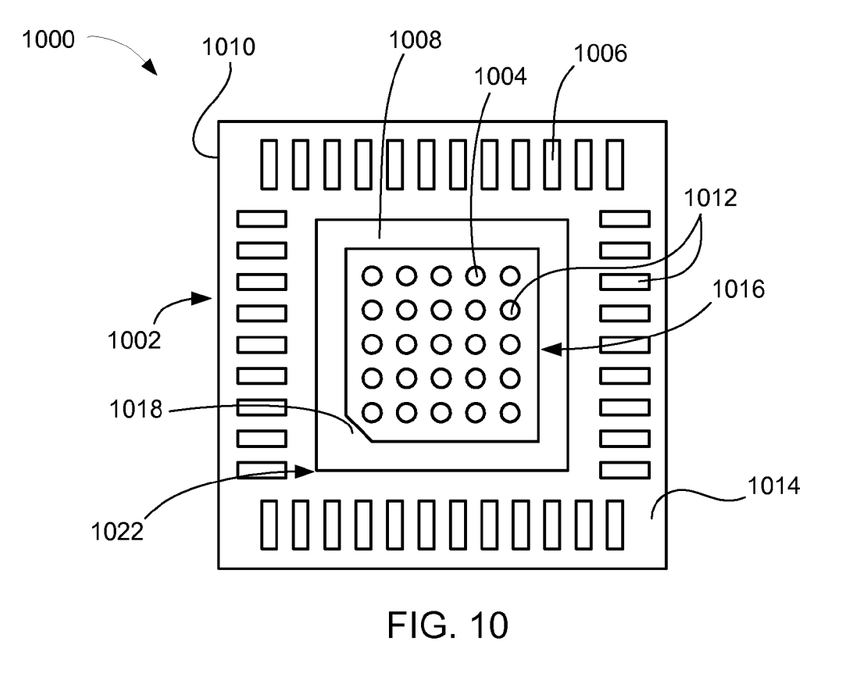
FIG. 10 is a top view of an integrated circuit packaging system in a fourth embodiment of the present invention and after an inner stacking module forming phase of manufacture.

Referring now to FIG. 10, therein is shown a top view of an integrated circuit packaging system 1000 in a fourth embodiment of the present invention and after an inner stacking module forming phase of manufacture. The integrated circuit packaging system 1000 is shown having an inner stacking module 1002.

The inner stacking module 1002 is shown having inner contact pads 1004 and outer contact pads 1006. The outer contact pads 1006 are external to inner stacking module protrusions 1008 and are formed along a perimeter 1010 of the inner stacking module 1002. The inner contact pads 1004 and the outer contact pads 1006 have an exposed surface 1012 exposed from a top surface 1014 of the inner stacking module 1002.

The inner contact pads 1004 are interior to the inner stacking module protrusions 1008, and inside an inner stacking module cavity 1016. The inner stacking module cavity 1016 is created when the top surface 1014 of the inner stacking module 1002 is surrounded by the inner stacking module protrusions 1008.

An alignment indicia 1018 may be formed on a corner 1022 of the inner stacking module cavity 1016 out of the inner stacking module protrusions 1008 and may be formed with a unique contour such as a chamfer, notch, or extension tab.

Figure 11:
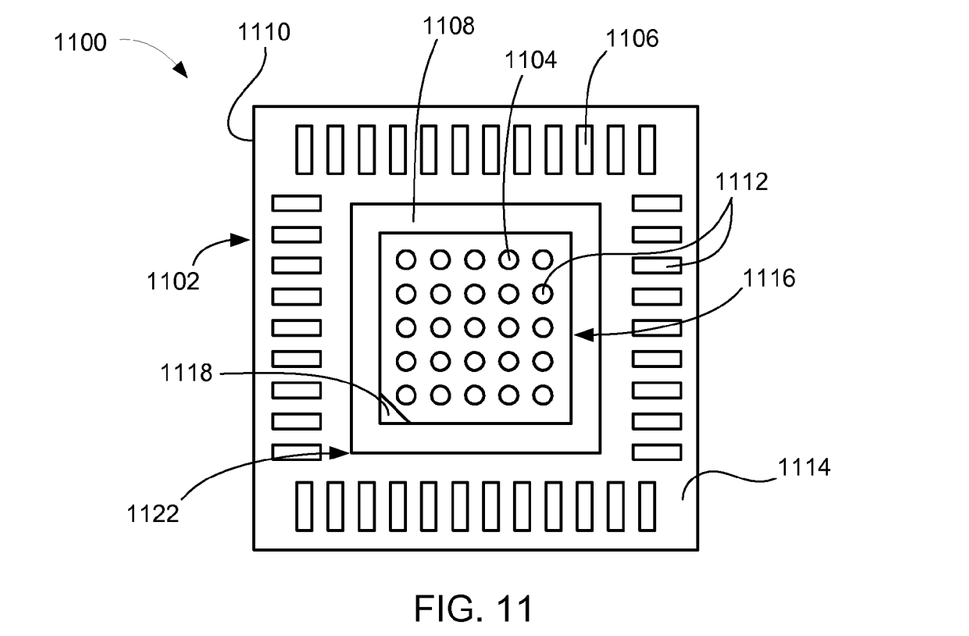
FIG. 11 is a top view of an integrated circuit packaging system in a fifth embodiment of the present invention and after an inner stacking module forming phase of manufacture.

Referring now to FIG. 11, therein is shown a top view of an integrated circuit packaging system 1100 in a fifth embodiment of the present invention and after an inner stacking module forming phase of manufacture. The integrated circuit packaging system 1100 is shown having an inner stacking module 1102.

The inner stacking module 1102 is shown having inner contact pads 1104 and outer contact pads 1106. The outer contact pads 1106 are external to inner stacking module protrusions 1108 and are formed along a perimeter 1110 of the inner stacking module 1102. The inner contact pads 1104 and the outer contact pads 1106 have an exposed surface 1112 exposed from a top surface 1114 of the inner stacking module 1102.

The inner contact pads 1104 are interior to the inner stacking module protrusions 1108, and inside an inner stacking module cavity 1116. The inner stacking module cavity 1116 is created when the top surface 1114 of the inner stacking module 1102 is surrounded by the inner stacking module protrusions 1108. An alignment indicia 1118 may be formed on a corner 1122 of the inner stacking module cavity 1116 and may be formed by metal deposition or plating.

Figure 12:
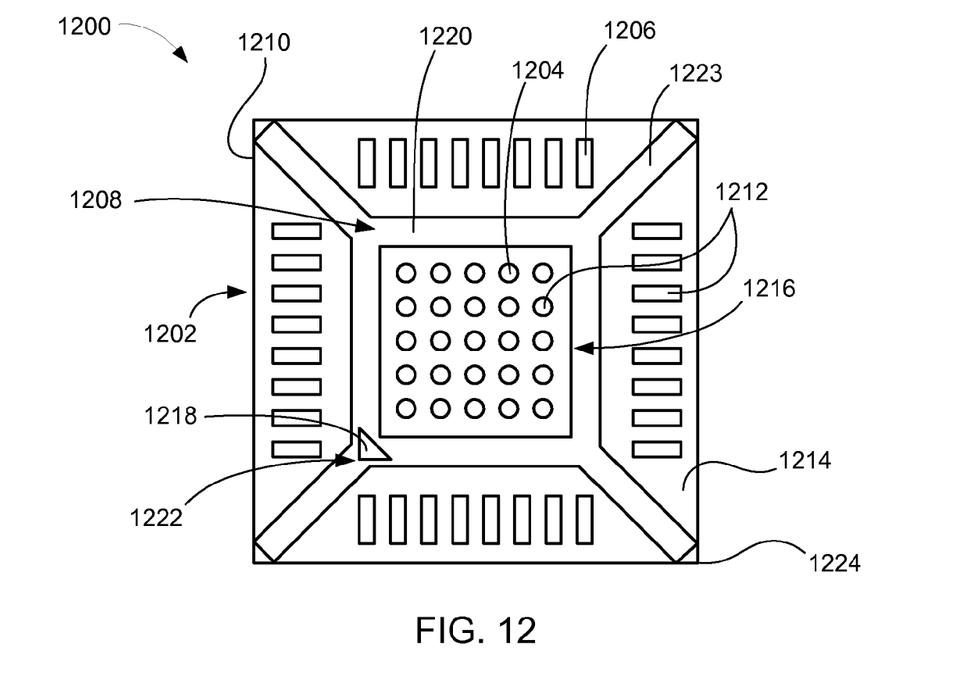
FIG. 12 is a top view of an integrated circuit packaging system in a sixth embodiment of the present invention and after an inner stacking module forming phase of manufacture.

Referring now to FIG. 12, therein is shown a top view of an integrated circuit packaging system 1200 in a sixth embodiment of the present invention and after an inner stacking module forming phase of manufacture. The integrated circuit packaging system 1200 is shown having an inner stacking module 1202.

The inner stacking module 1202 is shown having inner contact pads 1204 and outer contact pads 1206. The outer contact pads 1206 are external to inner stacking module protrusions 1208 and are formed along a perimeter 1210 of the inner stacking module 1202. The inner contact pads 1204 and the outer contact pads 1206 have an exposed surface 1212 exposed from a top surface 1214 of the inner stacking module 1202.

The inner contact pads 1204 are interior to the inner stacking module protrusions 1208, and inside an inner stacking module cavity 1216. The inner stacking module cavity 1216 is created when the top surface 1214 of the inner stacking module 1202 is surrounded by the inner stacking module protrusions 1208.

An alignment indicia 1218 may be formed on a planar protrusion surface 1220 of the inner stacking module protrusions 1208. The alignment indicia 1218 may be formed on a corner 1222 of the inner stacking module protrusions 1208 and may be formed by metal deposition or plating. The alignment indicia on the corner 1222 of the inner stacking module protrusions 1208 is applicable for high I/O devices where transmission real estate is critical.

On the corner 1222 of the inner stacking module protrusions 1208 a protrusion extension 1223 extends from the corner 1222 of the inner stacking module protrusion 1208 to a corner 1224 of the perimeter 1210 on the inner stacking module 1202. It has been discovered that the inner stacking module protrusions 1208 which extends to the corner 1224 of the perimeter 1210 provides application specific reinforcement and stiffening to the inner stacking module 1202.

The inner stacking module protrusions 1208 extending to the corner 1224 of the perimeter 1210 also provides application specific segregation of the outer contact pads 1206 allowing for flexible application specific mounting and encapsulation designs.

Figure 13:
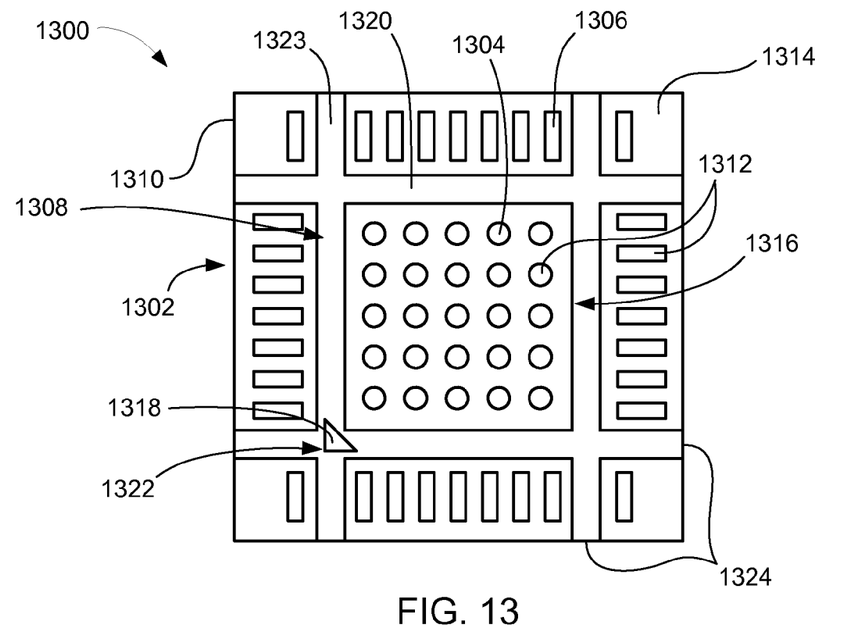
FIG. 13 is a top view of an integrated circuit packaging system in a seventh embodiment of the present invention and after an inner stacking module forming phase of manufacture.

Referring now to FIG. 13, therein is shown a top view of an integrated circuit packaging system 1300 in a seventh embodiment of the present invention and after an inner stacking module forming phase of manufacture. The integrated circuit packaging system 1300 is shown having an inner stacking module 1302.

The inner stacking module 1302 is shown having inner contact pads 1304 and outer contact pads 1306. The outer contact pads 1306 are external to inner stacking module protrusions 1308 and are formed along a perimeter 1310 of the inner stacking module 1302. The inner contact pads 1304 and the outer contact pads 1306 have an exposed surface 1312 exposed from a top surface 1314 of the inner stacking module 1302.

The inner contact pads 1304 are interior to the inner stacking module protrusions 1308, and inside an inner stacking module cavity 1316. The inner stacking module cavity 1316 is created when the top surface 1314 of the inner stacking module 1302 is surrounded by the inner stacking module protrusions 1308.

An alignment indicia 1318 may be formed on a planar protrusion surface 1320 of the inner stacking module protrusions 1308. The alignment indicia 1318 may be formed on a corner 1322 of the inner stacking module protrusions 1308 and may be formed by metal deposition or plating. The alignment indicia on the corner 1322 of the inner stacking module protrusions 1308 is applicable for high I/O devices where transmission real estate is critical.

On the corner 1322 of the inner stacking module protrusions 1308, a protrusion extension 1323 extends from the corner 1322 of the inner stacking module protrusion 1308 to an edge 1324 of the perimeter 1310 on the inner stacking module 1302. It has been discovered that the inner stacking module protrusions 1308 which extends to the edges 1324 of the perimeter 1310 provides application specific reinforcement and stiffening to the inner stacking module 1302.

The inner stacking module protrusions 1308 extending to the edges 1324 of the perimeter 1310 also provides application specific segregation of the outer contact pads 1306 allowing for flexible application specific mounting and encapsulation designs.

Figure 14:
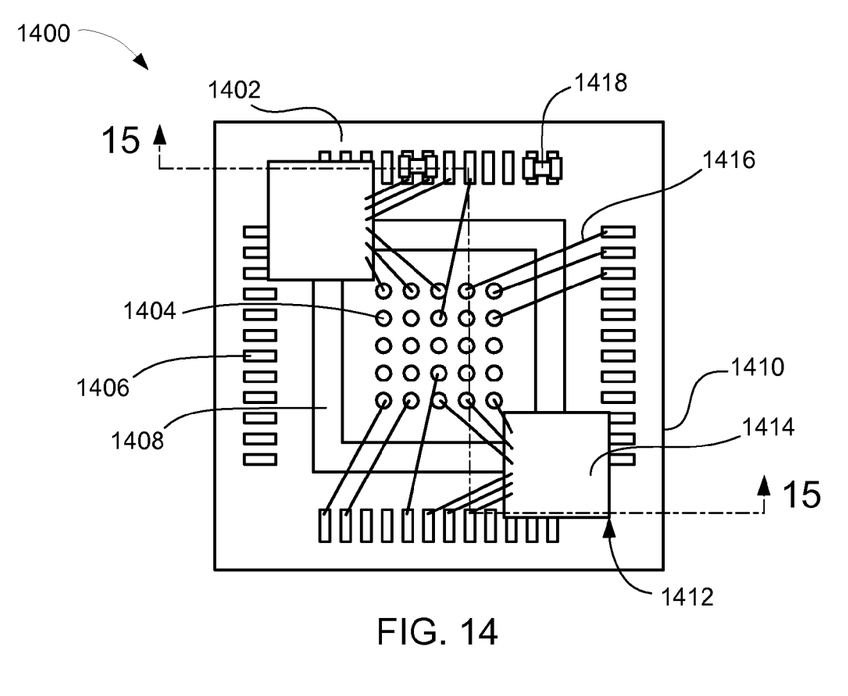
FIG. 14 is a top view of an integrated circuit packaging system in an eighth embodiment of the present invention and after wire-bonding phase of manufacture.

Referring now to FIG. 14, therein is shown a top view of an integrated circuit packaging system 1400 in an eighth embodiment of the present invention and after a wire-bonding phase of manufacture. The integrated circuit packaging system 1400 is shown having a carrier 1402.

The carrier 1402 may be copper, aluminum, or dummy silicon. Deposited above the carrier 1402 are inner contact pads 1404 and outer contact pads 1406. The inner contact pads 1404 are interior to a carrier cavity 1408, while the outer contact pads 1406 are exterior to the carrier cavity 1408 and are situated along a perimeter 1410 of the carrier 1402.

Mounted above the carrier 1402 are multiple inner stacking module dies 1412 such as wire-bonded dies with active sides 1414. The active sides 1414 are connected to the inner contact pads 1404 and the outer contact pads 1406 with bond wires 1416.

The bond wires 1416 also connect outer contact pads 1406 with inner contact pads 1404. Passive components 1418 such as resistors, capacitors, or inductors, are mounted on the outer contact pads 1406.

Figure 15:
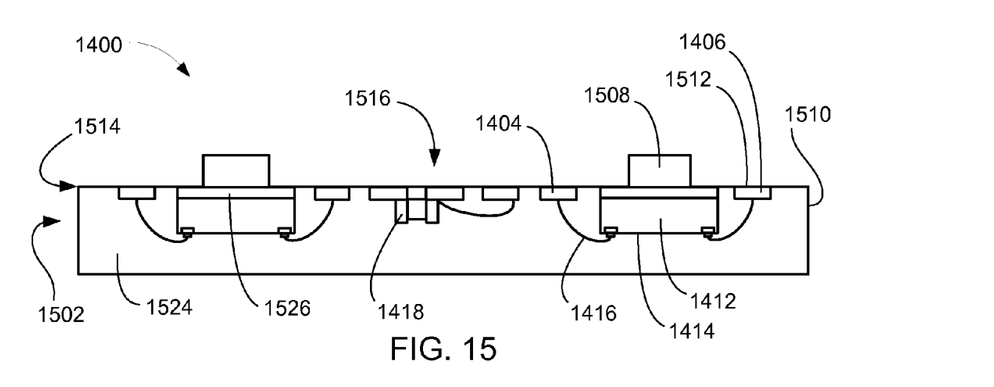
FIG. 15 is a cross-sectional view of the integrated circuit packaging system along the line 15-15 of FIG. 14.

Referring now to FIG. 15, therein is shown a cross-sectional view of the integrated circuit packaging system 1400 along the line 15-15 of FIG. 14. The integrated circuit packaging system 1400 is shown having an inner stacking module 1502.

The inner stacking module 1502 is shown having the inner contact pads 1404 and the outer contact pads 1406. The outer contact pads 1406 are external to an inner stacking module protrusion 1508 and are formed along a perimeter 1510 of the inner stacking module 1502. The inner contact pads 1404 and the outer contact pads 1406 have an exposed surface 1512 exposed from a top surface 1514 of the inner stacking module 1502.

The inner contact pads 1404 are interior to the inner stacking module protrusions 1508 inside an inner stacking module cavity 1516. The inner stacking module cavity 1516 is created when the top surface 1514 of the inner stacking module 1502 is surrounded by the inner stacking module protrusions 1508.

Mounted below the top surface 1514 are the multiple inner stacking module dies 1412, with the active sides 1414. The multiple inner stacking module dies 1412 are mounted beneath the inner stacking module protrusions 1508. The passive components 1418 are mounted beneath the outer contact pads 1406.

The active sides 1414 of the multiple inner stacking module dies 1412 are connected to the inner contact pads 1404 and the outer contact pads 1406 with the bond wires 1416. The bond wires 1416 also connect the inner contact pads 1404 to the outer contact pads 1406.

The inner stacking module protrusions 1508 is formed out of an inner stacking module encapsulation 1524, which encapsulates the multiple inner stacking module dies 1412 and the bond wires 1416. Between the multiple inner stacking module dies 1412 and the top surface 1514 is an adhesive 1526. The adhesive 1526 is preferably a high thermally conductive adhesive.

Figure 16:
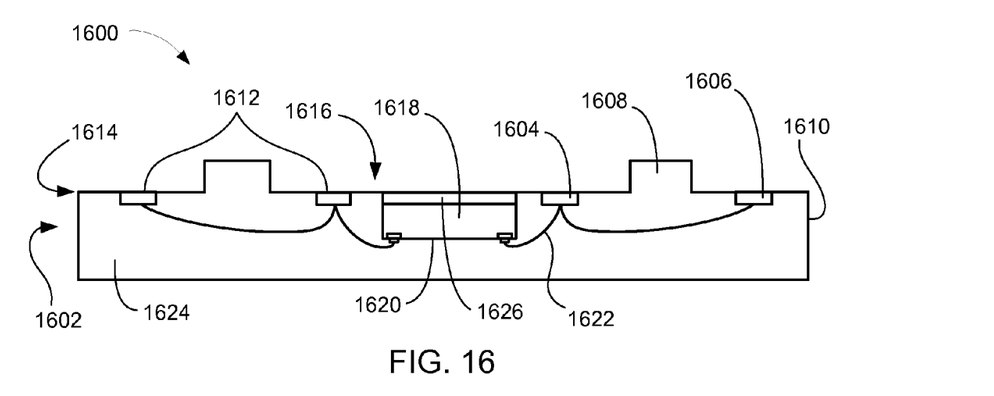
FIG. 16 is a cross-sectional view of an integrated circuit packaging system in a ninth embodiment of the present invention and after an inner stacking module forming phase of manufacture.

Referring now to FIG. 16, therein is shown a cross-sectional view of an integrated circuit packaging system 1600 in a ninth embodiment of the present invention and after an inner stacking module forming phase of manufacture. The integrated circuit packaging system 1600 is shown having an inner stacking module 1602.

The inner stacking module 1602 is shown having inner contact pads 1604 and outer contact pads 1606. The outer contact pads 1606 are external to inner stacking module protrusions 1608 and are formed along a perimeter 1610 of the inner stacking module 1602. The inner contact pads 1604 and the outer contact pads 1606 have an exposed surface 1612 exposed from a top surface 1614 of the inner stacking module 1602.

The inner contact pads 1604 are interior to the inner stacking module protrusions 1608 inside an inner stacking module cavity 1616. The inner stacking module cavity 1616 is created when the top surface 1614 of the inner stacking module 1602 is surrounded by the inner stacking module protrusions 1608.

Mounted below the top surface 1614 is an inner stacking module die 1618, such as a wire-bonded die, with an active side 1620. The active side 1620 of the inner stacking module die 1618 is connected to the inner contact pads 1604 with bond wires 1622. The bond wires 1622 also connect the inner contact pads 1604 to the outer contact pads 1606.

The inner stacking module protrusions 1608 are formed out of an inner stacking module encapsulation 1624, which encapsulate the inner stacking module die 1618 and the bond wires 1622. Between the inner stacking module die 1618 and the top surface 1614 is an adhesive 1626. The adhesive 1626 is preferably a high thermally conductive adhesive.

Figure 17:
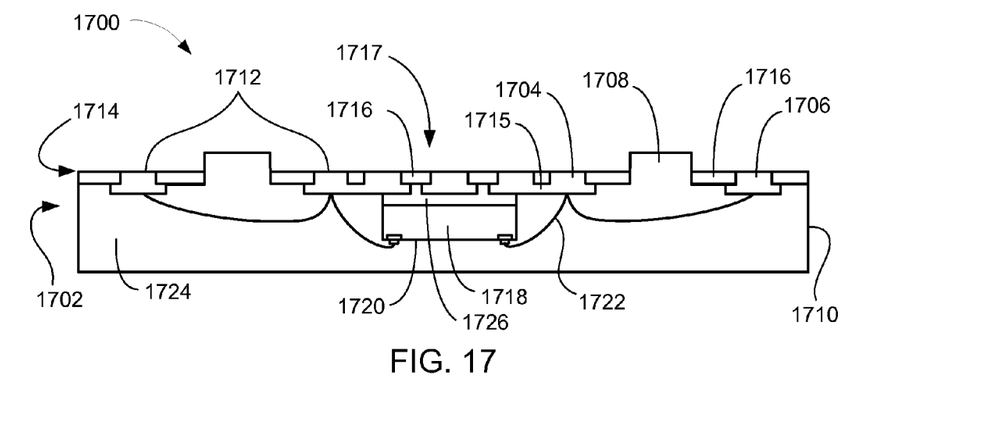
FIG. 17 is a cross-sectional view of an integrated circuit packaging system in a tenth embodiment of the present invention and after an inner stacking module forming phase of manufacture.

Referring now to FIG. 17, therein is shown a cross-sectional view of an integrated circuit packaging system 1700 in a tenth embodiment of the present invention and after an inner stacking module forming phase of manufacture. The integrated circuit packaging system 1700 is shown having an inner stacking module 1702.

The inner stacking module 1702 is shown having inner contact pads 1704 and outer contact pads 1706. The outer contact pads 1706 are external to inner stacking module protrusions 1708 and are formed along a perimeter 1710 of the inner stacking module 1702. The inner contact pads 1704 and the outer contact pads 1706 have an exposed surface 1712 exposed from a top surface 1714 of the inner stacking module 1702. Between the inner contact pads 1704 and the outer contact pads 1706 is an insulation layer 1716.

Further, the inner contact pads 1704 are connected with line 1715 under the inner contact pads 1704 and deposited on the top surface 1714 of the inner stacking module 1702. The inner contact pads 1704 are interior to the inner stacking module protrusions 1708 inside an inner stacking module cavity 1717. The inner stacking module cavity 1717 is created when the top surface 1714 of the inner stacking module 1702 is surrounded by the inner stacking module protrusions 1708.

Mounted below the top surface 1714 is an inner stacking module die 1718, such as a wire-bonded die, with an active side 1720. The active side 1720 of the inner stacking module die 1718 is connected to the inner contact pads 1704 with bond wires 1722. The bond wires 1722 also connect the inner contact pads 1704 to the outer contact pads 1706.

The inner stacking module protrusions 1708 is formed out of an inner stacking module encapsulation 1724, which encapsulate the inner stacking module die 1718 and the bond wires 1722. The inner stacking module die 1718 is attached to the routing line 1715 and the insulation layer 1716 with an adhesive 1726. The adhesive 1726 is preferably a high thermally conductive adhesive.

Figure 18:
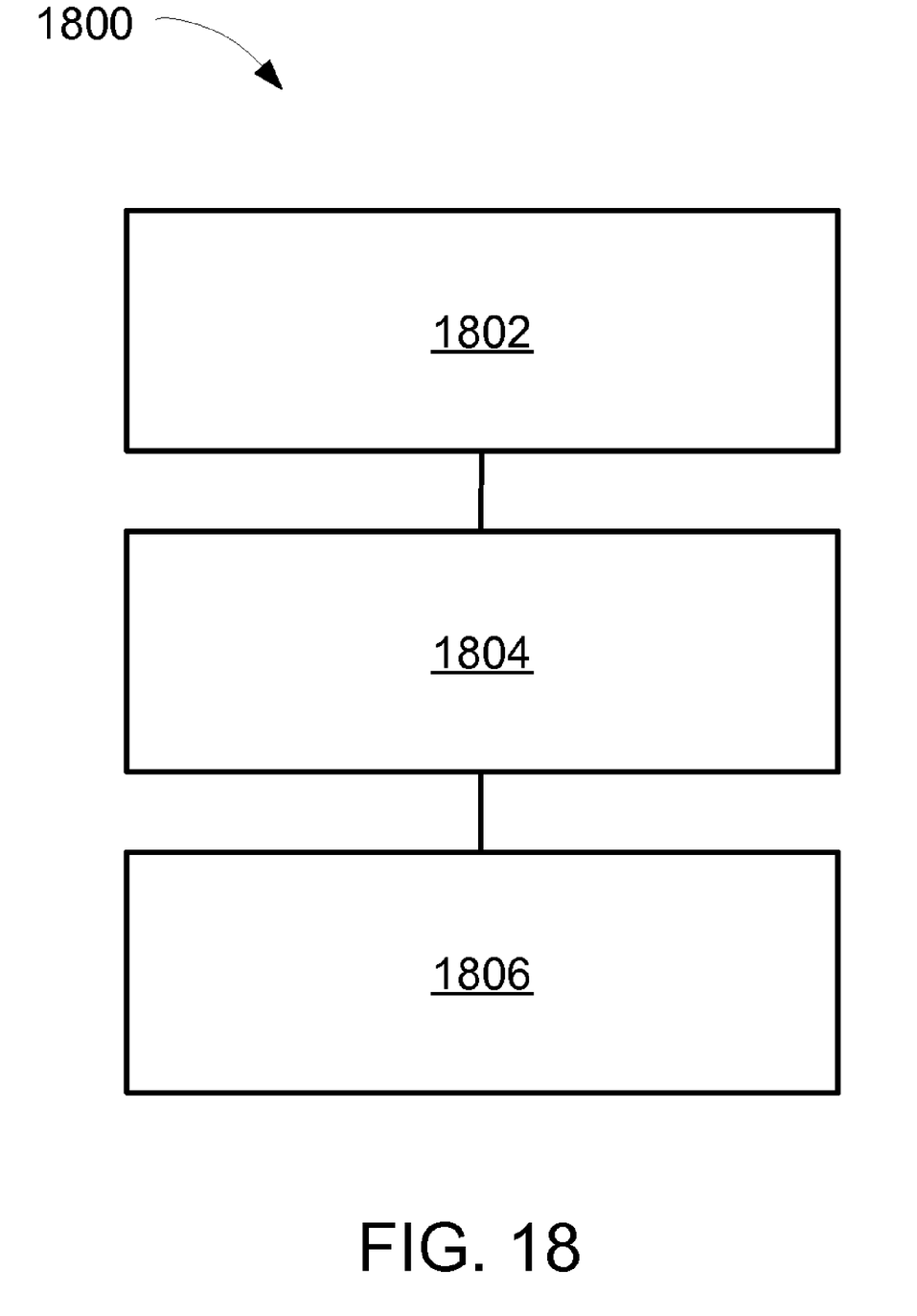
FIG. 18 is a flow chart of a method of manufacture of an integrated circuit packaging system of FIG. 1 in a further embodiment of the present invention.

Referring now to FIG. 18, therein is shown a flow chart of a method 1800 of manufacture of an integrated circuit packaging system 100 of FIG. 1 in a further embodiment of the present invention. The method 1800 includes providing an inner stacking module die in a block 1802; encapsulating the inner stacking module die with an inner stacking module encapsulation to form an inner stacking module, the inner stacking module encapsulation having an inner stacking module protrusion having a planar protrusion in a block 1804; and encapsulating at least part of the inner stacking module encapsulation with an encapsulation having a flat top coplanar with the planar protrusion surface or fully encapsulating the inner stacking module in a block 1806.

A principle aspect that has been unexpectedly discovered is that the present invention that the inner stacking module protrusions may be used as a stiffener or a reinforcement to prevent warpage of the inner stacking module and the integrated circuit packaging system.

Another aspect is the planar protrusion surface reduces production cost by allowing the use of conventional molding chases during encapsulation phases of manufacture. This reduces design time.

Another aspect is the inner stacking module protrusions may act as a solder ball standoff height structure helping to prevent excess stress on solder balls resulting in more reliable contacts with an increased life span.

Still another aspect is the inner stacking module protrusions help to support additional integrated circuit packages above the inner stacking module adding increased functionality with minimal application specific design investment.

Yet another aspect is the inner stacking module protrusions act as a barrier to contain the underfill and prevent overspreading, which may result in contamination of the contact pads.

Finally, another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the inner stacking module protrusion of the present invention furnishes important and heretofore unknown and unavailable solutions, capabilities, and functional aspects for package configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a module die;
   connecting the module die to a first contact pad and a second contact pad of an inner stacking module encapsulation;
   encapsulating the module die with the inner stacking module encapsulation to form an inner stacking module, the inner stacking module encapsulation having an inner stacking module protrusion having a planar protrusion surface and the inner stacking module protrusion surrounds an inner stacking module cavity, the inner stacking module protrusion separates the first contact pad and the second contact pad with the first contact pad being along a perimeter of the inner stacking module encapsulation and with the second contact pad being positioned in the inner stacking module cavity; and
   encapsulating at least part of the inner stacking module encapsulation with an encapsulation having a flat top coplanar with the planar protrusion surface or fully encapsulating the inner stacking module encapsulation.

2. The method as claimed in claim 1 further comprising:
   forming an alignment indicia in the inner stacking module encapsulation on a corner of the inner stacking module protrusion, on a corner of the inner stacking module cavity, or a combination thereof.

3. The method as claimed in claim 1 further comprising:
   mounting an internal interconnect to the module die.

4. The method as claimed in claim 1 further comprising:
   forming an insulation layer, a routing line, or a combination thereof above the module die.

5. The method as claimed in claim 1 wherein:
   encapsulating the module die includes forming the inner stacking module protrusions with a corner and a protrusion extension extending from the corner of the inner stacking module protrusion to a corner of a perimeter on the inner stacking module, an edge of the perimeter, or a combination thereof.

6. A method of manufacture of an integrated circuit packaging system comprising:
   providing a module die;
   connecting the module die to a first contact pad and a second contact pad of an inner stacking module encapsulation;
   encapsulating the module die with the inner stacking module encapsulation to form an inner stacking module, the inner stacking module encapsulation having an inner stacking module protrusion having a planar protrusion surface and the inner stacking module protrusion surrounds an inner stacking module cavity, the inner stacking module protrusion separates the first contact pad and the second contact pad with the first contact pad being along a perimeter of the inner stacking module encapsulation and with the second contact pad being positioned in the inner stacking module cavity;

mounting the inner stacking module over a substrate;

connecting the inner stacking module to the substrate with a bond wire; and encapsulating at least part of the inner stacking module encapsulation with an encapsulation having a flat top coplanar with the planar protrusion surface or fully encapsulating the inner stacking module encapsulation.

7. The method as claimed in claim 6 wherein:

forming inner stacking module protrusion includes forming the inner stacking module on a carrier having a carrier cavity.

8. The method as claimed in claim 6 further comprising:

mounting an inner package between the inner stacking module encapsulation and the substrate.

9. The method as claimed in claim 6 further comprising:

mounting a first integrated circuit die between the substrate and the inner stacking module; and mounting a second integrated circuit die above the inner stacking module.

10. The method as claimed in claim 6 further comprising:

mounting passive components to the contact pads.

11. An integrated circuit packaging system comprising:

a module die;

a first contact pad and a second contact pad of an inner stacking module encapsulation connected to the module die;

an inner stacking module encapsulation encapsulating the module die to form the inner stacking module, the inner stacking module encapsulation having an inner stacking module protrusion having a planar protrusion surface and the inner stacking module protrusion surrounds an inner stacking module cavity, the inner stacking module protrusion separates the first contact pad and the second contact pad with the first contact pad being along a perimeter of the inner stacking module encapsulation and with the second contact pad being positioned in the inner stacking module cavity; and an encapsulation encapsulating at least part of the inner stacking module encapsulation having a flat top coplanar with the planar protrusion surface or fully encapsulating the inner stacking module encapsulation.

12. The system as claimed in claim 11 further comprising:

an alignment indicia formed in the inner stacking module encapsulation, or an alignment indicia deposited on a corner of the inner stacking module protrusion, on a corner of the inner stacking module cavity, or a combination thereof.

13. The system as claimed in claim 11 further comprising:

an internal interconnect mounted to the module die.

14. The system as claimed in claim 11 further comprising:

an insulation layer, a routing line, or a combination thereof formed above the module die.

15. The system as claimed in claim 11 wherein:

the inner stacking module protrusion has a corner and a protrusion extension extending from the corner of the inner stacking module protrusion to a corner of a perimeter on the inner stacking module, an edge of the perimeter, or a combination thereof.

16. The system as claimed in claim 11 further comprising:

a substrate mounted below the inner stacking module encapsulation;

a bond wire connecting inner stacking module to the substrate; and wherein:

the encapsulation encapsulates the bond wire.

17. The system as claimed in claim 16 wherein:

the module die is mounted beneath the inner stacking module protrusion.

18. The system as claimed in claim 16 further comprising:

an inner package mounted between the inner stacking module encapsulation and the substrate.

19. The system as claimed in claim 16 further comprising:

a first integrated circuit die mounted between the substrate and the inner stacking module; and a second integrated circuit die mounted above the inner stacking module.

20. The system as claimed in claim 16 further comprising:

passive components mounted to the contact pads.

* * * * *